(12) United States Patent
Li et al.

(10) Patent No.: US 11,070,008 B2
(45) Date of Patent: Jul. 20, 2021

(54) SENSOR WITH CIRCUIT PROTECTION MODULE

(71) Applicants: Measurement Specialties (China) Ltd., Shenzhen (CN); Measurement Specialties, Inc., Ewing, NJ (US)

(72) Inventors: Jun Li, Guangdong (CN); Lin Zhang, Guangdong (CN); Natasha V. Kachenko, Fremont, CA (US); Vincent Wong, Fremont, CA (US); Tuyen Nguyen, Fremont, CA (US)

(73) Assignees: Measurement Specialties (China) Ltd., Shenzhen (CN); Measurement Specialties, Inc., Ewing, NJ (US)

( * ) Notice: Subject to any disclaimer, the term of this patent is extended or adjusted under 35 U.S.C. 154(b) by 0 days.

(21) Appl. No.: 16/784,484

(22) Filed: Feb. 7, 2020

(65) Prior Publication Data
US 2020/0259299 A1    Aug. 13, 2020

(30) Foreign Application Priority Data
Feb. 12, 2019 (CN) .......................... 201920191797.6

(51) Int. Cl.
*H01R 13/66* (2006.01)
*G01R 19/145* (2006.01)
(Continued)

(52) U.S. Cl.
CPC ....... *H01R 13/6683* (2013.01); *G01D 11/245* (2013.01); *G01D 21/00* (2013.01);
(Continued)

(58) Field of Classification Search
CPC .... H01R 13/6683; H02H 3/08; G01D 11/245; G01D 21/00; G01R 19/145; G01R 19/165
(Continued)

(56) References Cited

U.S. PATENT DOCUMENTS 5,027,656 A * 7/1991 Garrison ................. G01F 23/60
73/313
5,177,661 A * 1/1993 Zavracky .............. G01L 9/0042
361/283.4

(Continued)

*Primary Examiner* — Abdullah A Riyami
*Assistant Examiner* — Vladimir Imas
(74) *Attorney, Agent, or Firm* — Saxton & Stump, LLC

(57) ABSTRACT

The present application provides a sensor, relates to sensing technology field, the sensor includes a sensor body, a main circuit module disposed in the sensor body and an sensing assembly electrically connect to the main circuit module, and further includes a circuit protection module disposed at outside of the sensor body and electrically connected to the main circuit module. In the present application, the main circuit module and the sensing assembly are used as the core components to achieve the functions of sensing and information conversion of the sensor; the circuit protection module is disposed outside the sensor body to realize the circuit protection function of the sensor. Specifically, the sensor can pass the test of the lightning surge test standard IEC61000-4-5 surge, and can also protect from static electricity of a high level and the impact of the electric fast transient pulse group; in addition, since the circuit protection module is disposed outside of the sensor body and the inner volume of the sensor is not occupied, such that the circuit protection performance of the sensor is further optimized and improved without any change on the inherent structure of the sensor body.

14 Claims, 4 Drawing Sheets

(51) Int. Cl.
*G01D 21/00* (2006.01)
*H02H 3/08* (2006.01)
*G01D 11/24* (2006.01)
*G01R 19/165* (2006.01)

(52) U.S. Cl.
CPC ......... *G01R 19/145* (2013.01); *G01R 19/165* (2013.01); *H02H 3/08* (2013.01)

(58) Field of Classification Search
USPC .................................................. 439/620.21
See application file for complete search history.

(56) References Cited

U.S. PATENT DOCUMENTS

| | | | | |
|---|---|---|---|---|
| 5,302,138 A * | 4/1994 | Shields | ............ | H01R 13/6683 |
| | | | | 439/527 |
| 5,318,459 A * | 6/1994 | Shields | ............ | H01R 13/6683 |
| | | | | 439/527 |
| 5,670,784 A * | 9/1997 | Cusack | ................ | G01J 5/0014 |
| | | | | 250/370.01 |
| 6,678,164 B2 * | 1/2004 | Chikuan | ............ | G01L 19/0084 |
| | | | | 361/752 |
| 6,798,347 B2 * | 9/2004 | Henry | .................... | G01D 11/24 |
| | | | | 340/680 |
| 6,799,984 B2 * | 10/2004 | Starta | .................. | H01R 13/527 |
| | | | | 439/139 |
| 6,938,506 B2 * | 9/2005 | Henry | .................... | G01D 11/24 |
| | | | | 73/866.5 |
| 7,138,926 B2 * | 11/2006 | Henry | .................... | G01D 11/24 |
| | | | | 340/693.5 |
| 7,367,831 B2 * | 5/2008 | Starta | .................. | H01R 13/527 |
| | | | | 439/246 |
| 7,686,651 B2 * | 3/2010 | Shinjo | .................. | G01L 19/148 |
| | | | | 439/620.22 |
| 7,699,658 B2 * | 4/2010 | Gaidosch | ............... | H01R 31/06 |
| | | | | 439/628 |
| 9,435,690 B2 * | 9/2016 | Hoffman | .............. | F23M 11/045 |
| 10,060,820 B2 * | 8/2018 | Chen | ...................... | B81B 7/0048 |
| 10,101,411 B2 * | 10/2018 | Yin | .......................... | G01R 33/07 |
| 10,392,959 B2 * | 8/2019 | Olechnowicz | .......... | G01J 5/046 |
| 10,411,619 B2 * | 9/2019 | Li | ........................... | H02P 29/50 |
| 10,651,609 B2 * | 5/2020 | Ueno | ................. | H01R 13/6625 |
| 10,784,815 B2 * | 9/2020 | Moslehi | ................. | H02S 40/34 |
| 2005/0204823 A1 * | 9/2005 | Murai | .................. | G01L 19/069 |
| | | | | 73/724 |
| 2008/0236307 A1 * | 10/2008 | Watanabe | ........... | G01D 11/245 |
| | | | | 73/865.8 |
| 2013/0273483 A1 * | 10/2013 | Spalding | ............... | G01J 5/0821 |
| | | | | 431/79 |
| 2013/0341420 A1 * | 12/2013 | Lister | .................. | G01N 33/246 |
| | | | | 239/1 |
| 2014/0338448 A1 * | 11/2014 | Ashino | ................ | G01L 19/143 |
| | | | | 73/488 |
| 2017/0038251 A1 * | 2/2017 | Spalding | ............... | G01J 5/0018 |
| 2019/0339133 A1 * | 11/2019 | Pulvermacher | ..... | A47J 37/0786 |
| 2019/0350065 A1 * | 11/2019 | Stuby, Jr. | ............. | H05B 47/115 |
| 2020/0287400 A1 * | 9/2020 | Tao | .......................... | H02J 7/00 |

* cited by examiner

SENSOR WITH CIRCUIT PROTECTION MODULE

TECHNICAL FIELD

The present application relates to the field of sensing technology, and more particularly to a sensor.

BACKGROUND

A sensor converts a sensed information into an identifiable electrical signal according to a certain rule, to allow a user to detect the related information and achieve effective control. The sensor has been applied in various fields, including industrial production, aerospace, marine exploration and even civilian production and so on, and its working environment is inevitably exposed to the outdoors, therefore lightning surge protection for the sensor is particularly critical.

However, for the protection from higher-level surge lightning currents, it is necessary to add protection devices with a larger power and a larger size, while the space of the circuit board in the existing sensors is not enough to add additional protective devices, and the protection effect is poor. Therefore, the existing sensors often need to greatly change the structure of the original sensor to add lightning surge protective devices to improve the protection effect, which leads to an increase in production cost and an extended development cycle.

SUMMARY

An object of the present application is to provide a sensor, in order to solve the problem in the prior art that it is impossible to add a lightning surge protective device without changing the structure of the sensor and the lightning surge current protection effect is not good.

In order to solve above object, the technical solution adopted by the present application is that a sensor includes a sensor body, the sensor body including:

a main circuit module, disposed in the sensor body; and a sensing assembly, disposed in the sensor body and configured to be electrically connected to the main circuit module;

the sensor further includes a circuit protection module, the circuit protection module is disposed at outside of the sensor body and configured to be electrically connected to the main circuit module.

Further, the circuit protection module is provided with an anti-static circuit, and/or a lightning surge protection circuit, and/or an over-pulse protection circuit.

Further, the circuit protection module includes a transient suppression diode electrically connected to the main circuit module.

Further, the circuit protection module includes a piezoresistor electrically connected to the main circuit module.

Further, the main circuit module is provided with a positive pole of an output terminal, a positive pole of a power supply terminal and a negative pole of a power supply terminal, and the circuit protection module includes a circuit board electrically connected to the main circuit module and a first transient suppression diode disposed at the circuit board, the first transient suppression diode is electrically connected between the positive pole of the power supply terminal and the negative pole of the power supply terminal.

Further, the circuit protection module further includes a second transient suppression diode disposed at the circuit board, and the second transient suppression diode is electrically connected between the positive pole of the output terminal and the negative pole of the power supply terminal.

Further, the circuit protection module further includes a third transient suppression diode disposed at the circuit board, and the third transient suppression diode is electrically connected between the positive pole of the power supply terminal and the positive pole of the output terminal.

Further, the sensor body includes a bottom case and a connector disposed at the bottom case, the bottom case and the connector are connected to each other to form a first receiving cavity, the main circuit module is disposed in the first receiving cavity and electrically connected to the connector.

Further, the connector is provided with output terminals, the circuit protection module includes a circuit board electrically connected to the main circuit module, the circuit board is provided with a pad, the output terminals are respectively welded and fixed at the pads.

Further, the respective output terminal is welded adjacent to a side of the respective pad, or the respective output terminal is welded at a central portion of the respective pad.

Further, the output terminals and the first transient suppression diode are respectively located at opposite surfaces of the circuit board.

Further, the sensing assembly includes a diaphragm support and a sensing element disposed at the diaphragm support, wherein the sensing element is electrically connected to the main circuit module.

Further, the sensor further includes a housing, and the housing is covered at the connector, wherein the housing is provided with a second receiving cavity therein, the circuit protection module is disposed in the second receiving cavity.

Further, the connector is provided with output terminals, the sensor further includes a cable electrically connected to the output terminals and extending outside of the housing, the housing is provided with an opening for the cable to pass through.

Further, the sensor further includes a sealant, and the sealant is disposed at the position of the opening for sealing the opening and surrounding a periphery of the cable.

The beneficial effects of the sensor provided by the present application are as follows:

Compared with the prior art, in the present application, the main circuit module and the sensing assembly are used as the core components to achieve the functions of sensing and information conversion of the sensor; the circuit protection module is disposed outside the sensor body to realize the circuit protection function of the sensor. Specifically, the sensor can pass the test of the lightning surge test standard IEC61000-4-5 surge, and can also protect from static electricity of a high level and the impact of the electric fast transient pulse group; in addition, since the circuit protection module is disposed outside of the sensor body and the inner volume of the sensor is not occupied, such that the circuit protection performance of the sensor is further optimized and improved without any change on the inherent structure of the sensor body.

BRIEF DESCRIPTION OF THE DRAWINGS

In order to explain the embodiments of the present application more clearly, a brief introduction regarding the accompanying drawings that need to be used for describing the embodiments of the present application or the prior art is given below; it is obvious that the accompanying drawings described as follows are only some embodiments of the present application, for those skilled in the art, other drawings can also be obtained according to the current drawings on the premise of paying no creative labor.

Figure 1:
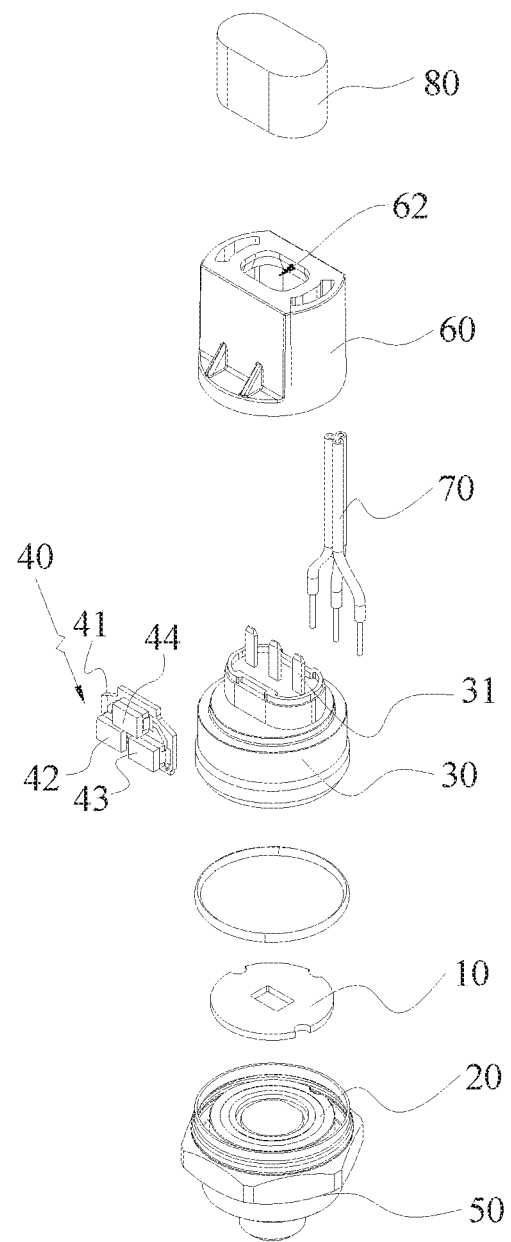
FIG. 1 is a schematic exploded structural view of a sensor according to embodiment 1 of the present application.

In the drawings, the reference numerals are listed and referred to as follows:

10—main circuit module; 11—positive pole of an output terminal; 12—positive pole of a power supply terminal; 13—negative pole of a power supply terminal; 20—sensing assembly; 30—connector; 31—output terminal; 40—circuit protection module; 41—circuit board; 411—pad; 42—first transient suppression diode; 43—second transient suppression diode; 44—third transient suppression diode; 50—bottom case; 51—first receiving cavity; 60—housing; 61—second receiving cavity; 62—opening; 70—cable; 80—sealant.

DETAILED DESCRIPTION OF THE EMBODIMENTS

In order to make the purpose, the technical solution and the advantages of the present application be clearer and more understandable, the present application will be further described in detail beneath with reference to accompanying figures and embodiments. It should be understood that the specific embodiments described herein are merely intended to illustrate but not to limit the present application.

It is noted that when a component is referred to as being "fixed to" or "disposed on" another component, it can be directly or indirectly on another component. When a component is referred to as being "connected to" another component, it can be directly or indirectly connected to another component.

In the description of the present application, it needs to be understood that, directions or location relationships indicated by terms such as "length", "width", "up", "down", "front", "rear", "left", "right", "vertical", "horizontal", "top", "bottom", "inside", "outside", and so on are the directions or location relationships shown in the accompanying figures, which are only intended to describe the present application conveniently and simplify the description, but not to indicate or imply that an indicated device or component must have specific locations or be constructed and manipulated according to specific locations; therefore, these terms shouldn't be considered as any limitation to the present application.

In addition, terms "the first" and "the second" are only used in describe purposes, and should not be considered as indicating or implying any relative importance, or impliedly indicating the number of indicated technical features. As such, technical feature(s) restricted by "the first" or "the second" can explicitly or impliedly comprise one or more such technical feature(s). In the description of the present application, "a plurality of" means two or more, unless otherwise specified or defined.

The term "lightning surge protection" refers to the prevention of damage to the sensor by lightning surge currents.

Figure 2:
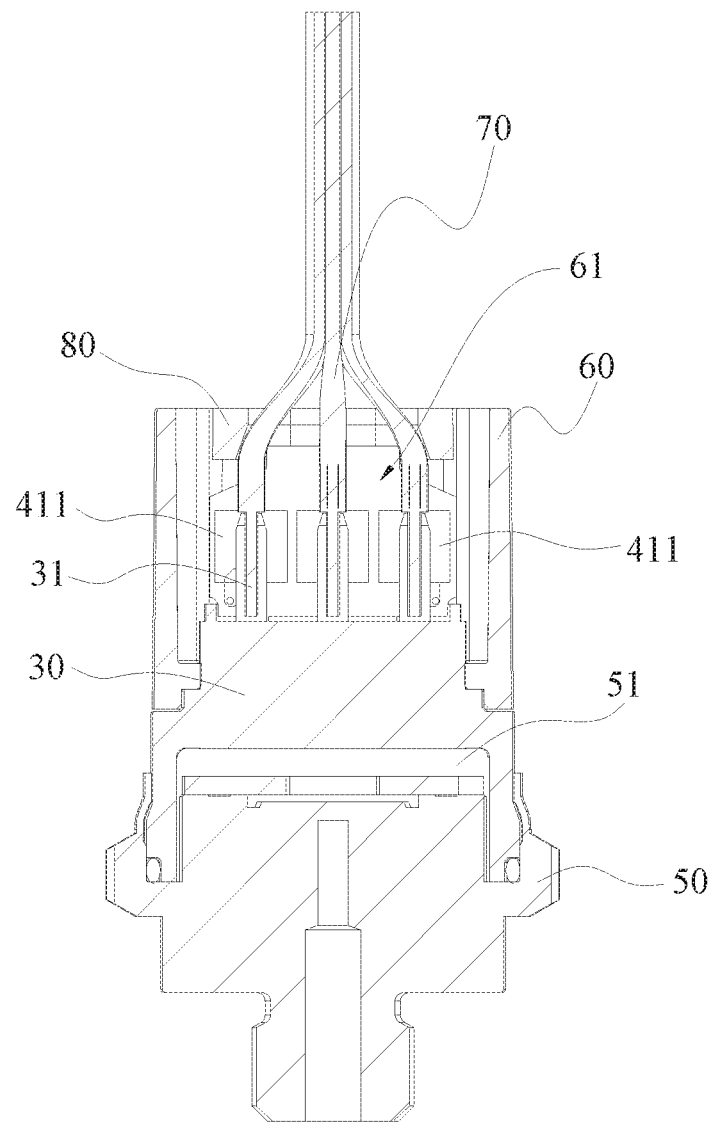
FIG. 2 is a schematic cross-sectional structural view of a sensor according to embodiment 1 of the present application.
Figure 3:
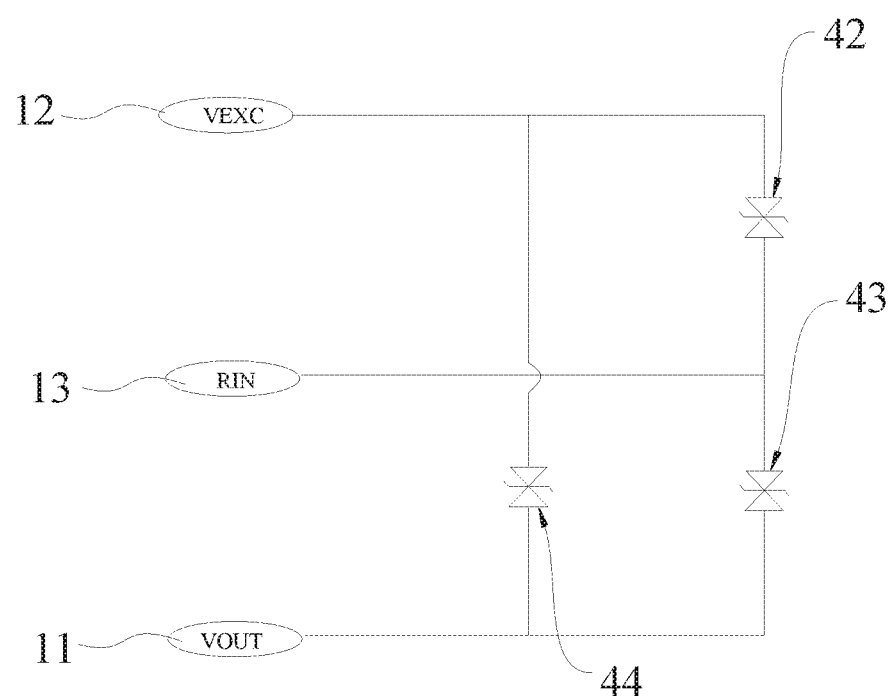
FIG. 3 is a schematic view of wiring of a first transient suppression diode, a second transient suppression diode, and a third transient suppression diode according to embodiment 1 of the present application.

Referring to FIG. 1 to FIG. 3, the sensor provided by the embodiment of the present application includes a sensor body, and the sensor body includes a main circuit module 10 and a sensing assembly 20 disposed in the sensor body, and the sensing component 20 is electrically connected to the main circuit module 10. The sensor further includes a circuit protection module 40 disposed outside the sensor body and electrically connected to the main circuit module 10.

In this embodiment, the main circuit module 10 and the sensing assembly 20 are used as the core components to achieve the functions of sensing and information conversion of the sensor; the circuit protection module 40 is disposed outside the sensor body to realize the circuit protection function of the sensor. Specifically, the sensor can pass the test of the lightning surge test standard IEC61000-4-5 surge, and can also protect from static electricity of a high level and the impact of the electric fast transient pulse group; in addition, since the circuit protection module is disposed outside of the sensor body and the inner volume of the sensor is not occupied, such that the circuit protection performance of the sensor is further optimized and improved without any change on the inherent structure of the sensor body.

Further, the circuit protection module 40 is provided with an anti-static circuit, a lightning surge protection circuit, and an over-pulse protection circuit. That is, in the embodiment, the circuit protection module 40 not only has an anti-lightning function, but also has anti-static and over-pulse protection function. In addition, the above circuits can also being only one or any two, and the circuit can be designed according to the actual application.

Specifically, the circuit protection module 40 includes a transient suppression diode electrically connected to the main circuit module 10. Or the circuit protection module includes a piezoresistor electrically connected to the main circuit module.

In this embodiment, the main circuit module 10 is provided with an positive pole of output terminal 11, a positive pole of a power supply terminal 12, and a negative pole of a power supply terminal 13. As a preferred solution, the circuit protection module 40 includes a circuit board 41 electrically connected to the main circuit module 10, a first transient suppression diode 42, a second transient suppression diode 43 and a third transient suppression diode 44 that are disposed at the circuit board 41. In which, the first transient suppression diode 42 is electrically connected between the positive pole of the power supply terminal 12 and the negative pole of the power supply terminal 13. The second transient suppression diode 43 is electrically connected between the positive pole of the output terminal 11 and the negative pole of the power supply terminal 13. The third transient suppression diode 44 is electrically connected between the positive pole of the power supply terminal 12 and the positive pole of the output terminal 11. Herein, such arrangement not only the lightning surge protection for the positive pole of the power supply terminal 12 and the negative pole of the power supply terminal 13, and the positive pole of the power supply terminal 12, and the positive pole of the output terminal 11 are realized, but also a double protection between the negative pole of the power supply terminal 13 and the positive pole of the output terminal 11 is realized, thereby further optimize its protection.

In addition, according to various factors such as the protection requirements of the sensor and the cost, it is also possible to provide only one or two transient suppression diodes herein. When only the first transient suppression diode 42 is provided, or the first transient suppression diode 42 and the second transient suppression diode 43 are provided, which can also achieve a certain protection effect.

In this embodiment, the sensor body includes a bottom case 50 and a connector 30 disposed at the bottom case 50. The bottom case 50 and the connector 30 are connected to each other to form a first receiving cavity 51, and the main circuit module 10 is placed in the first receiving cavity 51 and electrically connected to the connector 10, the circuit protection module 40 is disposed on the top of the connector 30 and electrically connected to the connector 10.

Figure 4:
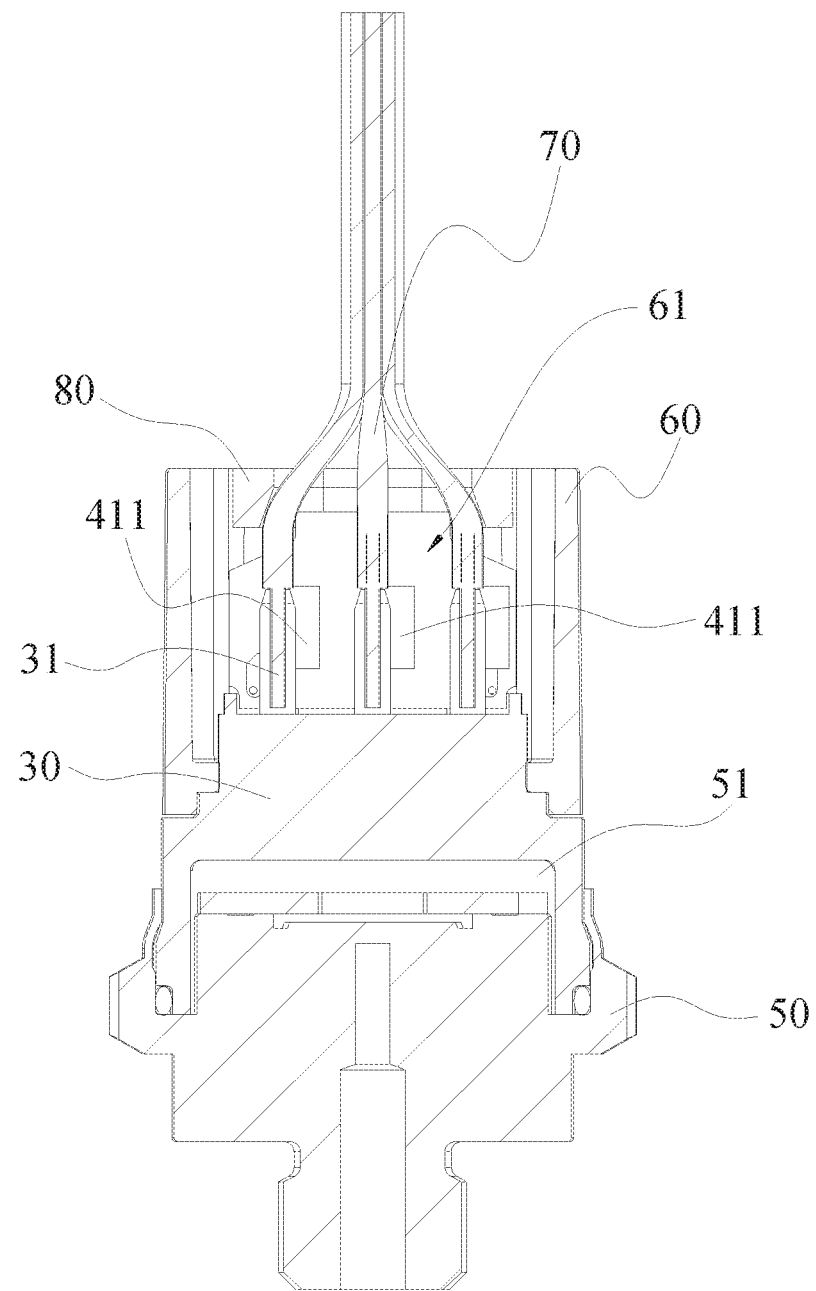
FIG. 4 is a schematic cross-sectional structural view of a sensor according to embodiment 2 of the present application.

Further, specifically, the connector 30 is provided with output terminals 31 (three shown in the drawings), and three pads 411 are correspondingly provided on the circuit board 41, and each of the output terminals 31 is welded and fixed to each of the pads 411. As shown in FIG. 2, the pad 411 has a large area, and the output terminal 31 is welded on the central portion of the pad 411. With this welding method, the welding reliability is high and the virtual welding is avoided. In addition, from the viewpoint of welding workability and cost, it is also possible to use a method shown in FIG. 4, that is, the output terminal 31 is translated relative to the pad 411, so that the output terminal 31 is welded adjacent to a side of the pad 411.

In this embodiment, three pads 411 are located on one surface of the circuit board 41, and the first transient suppression diode 42, the second transient suppression diode 43, and the third transient suppression diode 44 are located on the another surface of the circuit board 41. That is, there diodes are disposed opposite to the three pads 411.

In this embodiment, the sensing assembly 20 includes a diaphragm support and a sensing element (not shown) disposed at the diaphragm support. The sensing element is electrically connected to the main circuit module 10. The sensing element may be a strain gauge, and the strain gauge is deformed along the pressure of the diaphragm support to generate an electrical signal, which is transmitted to the main circuit module 10 through a wire (not shown).

In this embodiment, the sensor further includes a housing 60. The main circuit module 10 and the sensing assembly 20 are disposed in the first receiving cavity 51 between the bottom case 50 and the connector 30, and the housing 60 is covered on the connector 30. The housing 60 is provided with a second receiving cavity 61 therein, and the circuit protection module 40 is disposed in the second receiving cavity 61. The housing 60 is a hollow housing for covering above the connector 30 to protect the interior of the sensor body from erosion by moisture, dirt and the like. In this embodiment, not only the second accommodating cavity 61 formed between the housing 60 and the connector 30 is fully utilized, such that the entire sensor is compact in structure, and the sensor is made without any change in the structure of the sensor body itself, and the circuit protection performance is further optimized and improved.

Specifically, the housing 60 is a hollow housing with an opening at lower end thereof, the lower end of the housing 60 is covered on the periphery of the connector 30, the upper end of the housing 60 is provided with an opening 62, and the lower end surface of the housing 60 is adhered with the outer end surface of the connector 30.

Further, the sensor further includes a cable 70. One end of the cable 70 is electrically connected to the output terminal 31. The other end of the cable 70 extends out of the housing 60 through the opening 62 for electrical connection with an external device.

Further, the sensor further includes a sealant 80 disposed at the position of the opening 62 to seal the opening 62 and surrounding the periphery of the cable 70.

On the periphery of the cable 70 is further provided with a sealant (not shown), and the sealant is used for integrating and protecting the cable 70.

The aforementioned embodiments are only preferred embodiments of the present application, and should not be regarded as being limitation to the present application. Any modification, equivalent replacement, improvement, and so on, which are made within the spirit and the principle of the present application, should be included in the protection scope of the present application.

What is claimed is:

1. A sensor, comprising a sensor body, wherein the sensor body comprises:
   a main circuit module, disposed in the sensor body; and
   a sensing assembly, disposed in the sensor body and configured to be electrically connected to the main circuit module;
   wherein the sensor further comprises a circuit protection module, the circuit protection module being disposed outside of the sensor body and configured to be electrically connected to the main circuit module;
   wherein the main circuit module is provided with a positive pole of an output terminal, a positive pole of a power supply terminal and a negative pole of a power supply terminal, and the circuit protection module comprises: a circuit board electrically connected to the main circuit module, and a first transient suppression diode disposed at the circuit board, wherein the first transient suppression diode is electrically connected between the positive pole of the power supply terminal and the negative pole of the power supply terminal.

2. The sensor of claim 1, wherein the circuit protection module is provided with an anti-static circuit, and/or a lightning surge protection circuit, and/or an over-pulse protection circuit.

3. The sensor of claim 1, wherein the circuit protection module comprises a transient suppression diode electrically connected to the main circuit module.

4. The sensor of claim 1, wherein the circuit protection module comprises a piezoresistor electrically connected to the main circuit module.

5. The sensor of claim 1, wherein the circuit protection module further comprises a second transient suppression diode disposed at the circuit board, and the second transient suppression diode is electrically connected between the positive pole of the output terminal and the negative pole of the power supply terminal.

6. The sensor of claim 1, wherein the circuit protection module further comprises a third transient suppression diode disposed at the circuit board, and the third transient suppression diode is electrically connected between the positive pole of the power supply terminal and the positive pole of the output terminal.

7. A sensor, comprising a sensor body, wherein the sensor body comprises:
   a main circuit module, disposed in the sensor body; and
   a sensing assembly, disposed in the sensor body and configured to be electrically connected to the main circuit module;
   wherein the sensor further comprises a circuit protection module, the circuit protection module being disposed outside of the sensor body and configured to be electrically connected to the main circuit module;

the sensor body comprises a bottom case and a connector disposed at the bottom case, the bottom case and the connector are connected to each other to form a first receiving cavity, the main circuit module is disposed in the first receiving cavity and electrically connected to the connector.

8. The sensor of claim 7, wherein the connector is provided with output terminals, the circuit protection module comprises a circuit board electrically connected to the main circuit module, the circuit board is provided with pads, the output terminals are respectively welded and fixed at the pads.

9. The sensor of claim 8, wherein the respective output terminal is welded adjacent to a side of the respective pad, or the respective output terminal is welded at a central portion of the respective pad.

10. The sensor of claim 8, wherein the output terminals and the first transient suppression diode are respectively located at opposite surfaces of the circuit board.

11. A sensor, comprising a sensor body, wherein the sensor body comprises:
a main circuit module, disposed in the sensor body; and
a sensing assembly, disposed in the sensor body and configured to be electrically connected to the main circuit module;
wherein the sensor further comprises a circuit protection module, the circuit protection module being disposed outside of the sensor body and configured to be electrically connected to the main circuit module;
the sensing assembly comprises a diaphragm support and a a sensing element disposed at the diaphragm support, wherein the sensing element is electrically connected to the main circuit module.

12. The sensor of claim 7, wherein the sensor further comprises a housing, and the housing covers the connector, wherein the housing is provided with a second receiving cavity therein, and the circuit protection module is disposed in the second receiving cavity.

13. The sensor of claim 12, wherein the connector is provided with output terminals, the sensor further comprises a cable electrically connected to the output terminals and extending outside of the housing, the housing is provided with an opening for the cable to pass through.

14. The sensor of claim 12, wherein the sensor further comprises a sealant, and the sealant is disposed at the position of the opening for sealing the opening and surrounding a periphery of the cable.

* * * * *